(12) United States Patent
Wang et al.

(10) Patent No.: US 9,966,382 B2
(45) Date of Patent: May 8, 2018

(54) SEMICONDUCTOR STRUCTURE AND METHOD FOR FABRICATING THE SAME

(71) Applicant: United Microelectronics Corp., Hsinchu (TW)

(72) Inventors: Chia-Wen Wang, Tainan (TW); Hsiang-Chen Lee, Kaohsiung (TW); Wen-Peng Hsu, New Taipei (TW); Kuo-Lung Li, Yunlin County (TW); Meng-Chun Chen, Kaohsiung (TW); Zi-Jun Liu, Kaohsiung (TW); Ping-Chia Shih, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/238,574

(22) Filed: Aug. 16, 2016

(65) Prior Publication Data
US 2018/0053771 A1    Feb. 22, 2018

(51) Int. Cl.
| | |
|---|---|
| *H01L 27/115* | (2017.01) |
| *H01L 27/1157* | (2017.01) |
| *H01L 29/792* | (2006.01) |
| *H01L 29/78* | (2006.01) |
| *H01L 27/11573* | (2017.01) |
| *H01L 29/66* | (2006.01) |
| *H01L 21/28* | (2006.01) |
| *H01L 27/11543* | (2017.01) |
| *H01L 27/11563* | (2017.01) |

(52) U.S. Cl.
CPC .... *H01L 27/1157* (2013.01); *H01L 21/28282* (2013.01); *H01L 27/11543* (2013.01); *H01L 27/11563* (2013.01); *H01L 27/11573* (2013.01); *H01L 29/6659* (2013.01); *H01L 29/66833* (2013.01); *H01L 29/7833* (2013.01); *H01L 29/792* (2013.01)

(58) Field of Classification Search
CPC ......... H01L 27/11573; H01L 27/11563; H01L 27/11568; H01L 27/11541; H01L 27/11543; H01L 27/11546; H01L 27/11534; H01L 29/6659; H01L 29/7833; H01L 29/66833; H01L 29/792
See application file for complete search history.

(56) References Cited

U.S. PATENT DOCUMENTS

| | | | | |
|---|---|---|---|---|
| 6,346,725 | B1 * | 2/2002 | Ma | H01L 21/28273 257/316 |
| 6,924,200 | B2 | 8/2005 | Furukawa et al. | |
| 7,307,332 | B2 * | 12/2007 | Nakagawa | H01L 27/115 257/311 |
| 8,304,310 | B2 * | 11/2012 | Hashimoto | H01L 21/28202 257/E21.421 |
| 8,829,588 | B2 | 9/2014 | Horch | |
| 9,093,317 | B2 * | 7/2015 | Wang | H01L 29/788 |

* cited by examiner

*Primary Examiner* — Michael Trinh
(74) *Attorney, Agent, or Firm* — J.C. Patents

(57) ABSTRACT

A method for fabricating a semiconductor structure is shown. A first gate of a first device and a second gate of a second device are formed over a semiconductor substrate. First LDD regions are formed in the substrate beside the first gate using the first gate as a mask. A conformal layer is formed covering the first gate, the second gate and the substrate, wherein the conformal layer has sidewall portions on sidewalls of the second gate. Second LDD regions are formed in the substrate beside the second gate using the second gate and the sidewall portions of the conformal layer as a mask.

5 Claims, 2 Drawing Sheets

SEMICONDUCTOR STRUCTURE AND METHOD FOR FABRICATING THE SAME

BACKGROUND OF THE INVENTION

Field of Invention

This invention relates to a semiconductor process, and particularly relates to a method for fabricating a semiconductor structure, and to a semiconductor structure and a semiconductor device fabricated with the method.

Description of Related Art

A non-volatile memory (NVM) device usually has lightly doped drain (LDD) regions beside the gate. Conventionally, the LDD implantation is performed after the gate is formed but before the process of the ONO spacer, so that the distance between the opposite LDD regions is smaller. As a result, problems such as the short-channel effect are caused, and the chip probe (CP) yield and so on is lowered.

SUMMARY OF THE INVENTION

Accordingly, this invention provides a method for fabricating a semiconductor structure, which allows the LDD regions to be "pulled back" increasing the distance between the opposite LDD regions.

This invention also provides a semiconductor structure that is fabricated with the above method of this invention.

This invention also provides a method for fabricating a semiconductor device, which can be considered as a core part of the above method of this invention.

The method for fabricating a semiconductor structure of this invention is described as follows. A first gate of a first device and a second gate of a second device are formed over a semiconductor substrate. First LDD regions are formed in the substrate beside the first gate using the first gate as a mask. A conformal layer is formed covering the first gate, the second gate and the substrate, wherein the conformal layer has sidewall portions on the sidewalls of the second gate. Second LDD regions are formed in the substrate beside the second gate using the second gate and the sidewall portions of the conformal layer as a mask.

The semiconductor structure includes a first device and a second device. The first device includes a first gate, and first LDD regions beside the first gate. The second device includes a second gate, and second LDD regions beside the second gate. The distance between the second gate and each second LDD region is greater than the distance between the first gate and each first LDD region.

In an embodiment, the first device comprises a logic device and the second device comprises an NVM device. In such case, the conformal layer may comprise a first silicon oxide ($SiO_2$) layer for forming the first oxide layer of an ONO spacer, or may alternatively comprise a first $SiO_2$ layer and an SiN layer thereon, which are for forming the first oxide layer and the nitride layer of an ONO spacer, respectively.

When the conformal layer comprises the first $SiO_2$ layer for forming the first oxide layer of the ONO spacer, the inner border of each second LDD region of the NVM device is positioned between the sidewall of the second gate and the sidewall of the first $SiO_2$ layer, while each first LDD region of the logic device overlaps with the first gate.

The method for fabricating a semiconductor device of this invention is described as follows. A gate is formed over a semiconductor substrate. A conformal layer is formed covering the gate and the substrate, wherein the conformal layer has sidewall portions on the sidewalls of the gate. LDD regions are then formed in the substrate using the gate and the sidewall portions of the conformal layer as a mask.

In an embodiment, the semiconductor device comprises an NVM device, and the conformal layer may comprise the aforementioned.

Since the sidewall portions of the conformal layer also serve as a mask in the LDD implantation of the NVM device in this invention, the opposite LDD regions beside the gate of the NVM device can be pulled back so that their distance is increased and problems such as the short-channel effect are avoided.

In order to make the aforementioned and other objects, features and advantages of the present invention comprehensible, a preferred embodiment accompanied with figures is described in detail below.

BRIEF DESCRIPTION OF THE DRAWINGS

FIG. 1B-1 shows an exemplary structure of NVM device in the semiconductor structure in the first embodiment of this invention.

DESCRIPTION OF EMBODIMENTS

This invention will be further explained with the following embodiments and the accompanying drawings, which are however not intended to restrict the scope of this invention. For example, although the first device comprises a logic device and the second device comprises an NVM device in the following embodiments, this invention can be applied to fabrication of any two types of devices for which the distance between the gate and each LDD region of the second-type device is required to be greater than the distance between the gate and each LDD region of the first-type device. In addition, although the spacer is an ONO spacer in the following embodiments, the spacer may alternatively be other kind of composite spacer.

Figure 1A:
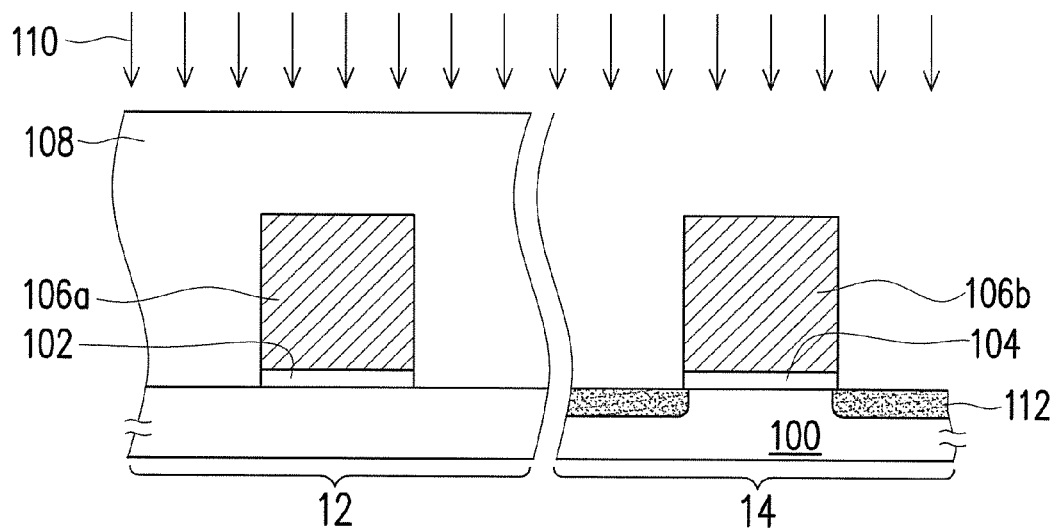
FIGS. 1A to 1D illustrate, in a cross-sectional view, a method for fabricating a semiconductor structure according to a first embodiment of this invention in which the LDD is implanted after the first oxide layer of the ONO spacer is deposited, wherein FIG. 1D also shows the semiconductor structure according to the first embodiment.
Figure 1B:
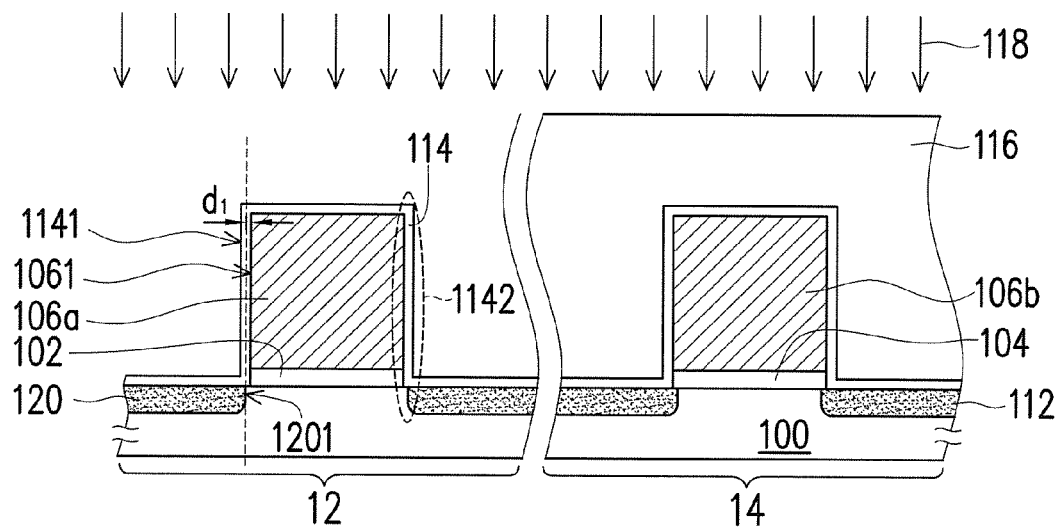
Figures 1, 1B:
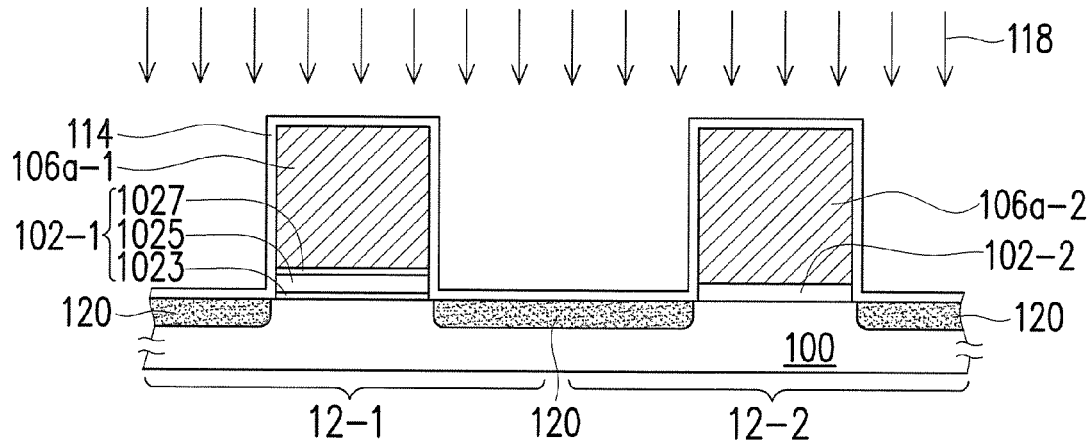
Figure 1C:
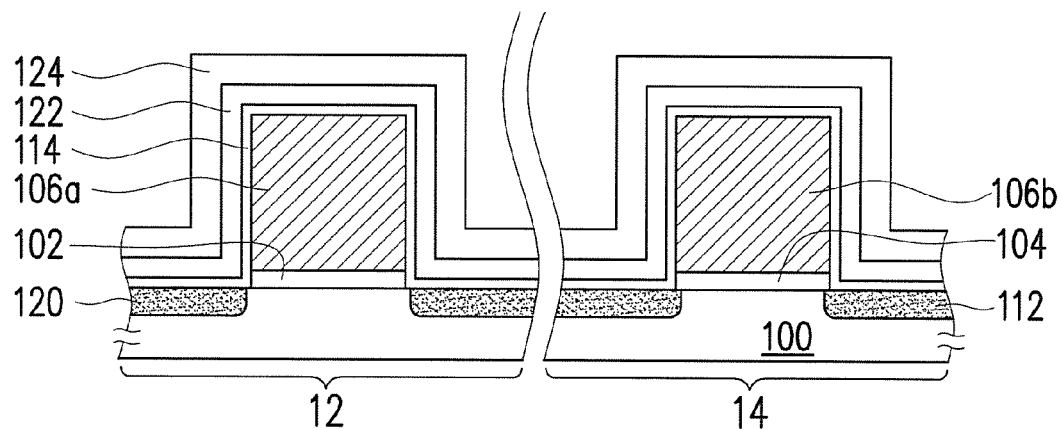
Figure 1D:
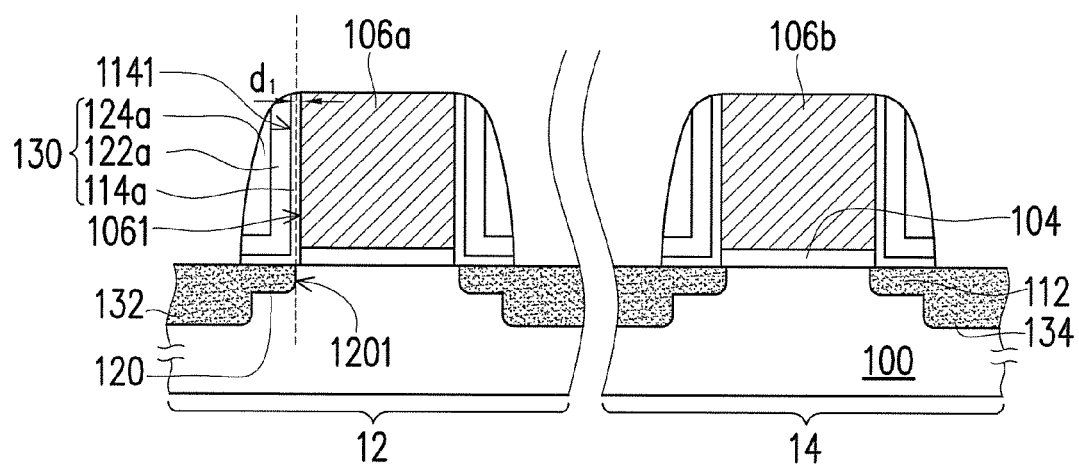

FIGS. 1A to 1D illustrate, in a cross-sectional view, a method for fabricating a semiconductor structure according to the first embodiment of this invention in which the LDD is implanted after the first oxide layer of the ONO spacer is deposited, wherein FIG. 1D also shows the semiconductor structure according to the first embodiment.

Referring to FIG. 1A, over a semiconductor substrate 100, an under-gate layer 102 is formed on the substrate 100 in an NVM device area 12, and a gate dielectric layer 104 is formed on the substrate 100 in a logic device area 14. The under-gate layer 102 may represent the charge storage layer of the NVM cell in the NVM device area 12, or both of the charge storage layer of the NVM cell and the gate dielectric layer of the select transistor that is also in the NVM device area 12 and coupled to the NVM cell. Then, the gate 106a of the NVM device is formed on the under-gate layer 102 in the NVM device area 12, and the gate 106b of the logic device is formed on the gate dielectric layer 104 in the logic device area 14 usually at the same time. The gate 106a may represent the gate of the NVM cell, or may represent both of the gate of the NVM cell and the gate of the select transistor, as described later.

Thereafter, a patterned photoresist layer 108 is formed covering the NVM area 12, and LDD implantation 110 is performed to form LDD regions 112 in the substrate 100 beside the gate 106b in the logic device area 14, using the patterned photoresist layer 108 and the gate 106b of the logic device as a mask. Each LDD region 112 slightly overlaps with the gate 106b of the logic device due to dopant diffusion.

Referring to FIG. 1B, after the patterned photoresist layer 108 is removed, a substantially conformal silicon oxide ($SiO_2$) layer 114, which is for forming the first oxide layer of the ONO spacer later, is formed covering the gate 106a of the NVM device, the gate 106b of the logic device, and the substrate 100. The $SiO_2$ layer 114 has, on the sidewalls of the gate 106a of the NVM device, sidewall portions 1142 that will serve as an implantation mask later. The $SiO_2$ layer 114 serve as the aforementioned conformal layer in the first embodiment. The thickness of the $SiO_2$ layer 114 may range from 30 Å to 150 Å.

Thereafter, another patterned photoresist layer 116 is formed covering the logic device area 14, and another LDD implantation 118 is performed to form LDD regions 120 in the substrate 100 beside the gate 106a in the NVM device area 12, using the patterned photoresist layer 116, the gate 106a of the NVM device and the sidewall portions 1142 of the $SiO_2$ layer 114 as a mask. Since the sidewall portions 1142 of the $SiO_2$ layer 114 also serves as an implantation mask, the distance $d_1$ between the gate 106a and each LDD region 120 of the NVM device is greater than the distance between the gate 106b and each LDD region 112 of the logic device, wherein the latter distance can be considered as zero because the gate 106b overlaps with each LDD region 112. Meanwhile, due to the dopant diffusion, the inner border 1201 of each LDD region 120 of the NVM device is positioned between the corresponding sidewall 1061 of the NVM gate 106a and the corresponding sidewall 1141 of the $SiO_2$ layer 114, as indicated by the dash line. The junction depth of the LDD 120 may range from 290 Å to 1900 Å.

In a case where the under-gate layer 102 in the NVM device area 12 represents both of the charge storage layer of the NVM cell and the gate dielectric of the select transistor and the gate 106a represents both of the gate of the NVM cell and the gate of the select transistor, an exemplary structure in the NVM device area 12 under the LDD implantation 118 is illustrated in FIG. 1B-1.

Referring to FIG. 1B-1, the NVM device area 12 includes an NVM cell area 12-1 and a select transistor area 12-2. A charge storage layer 102-1 of the NVM cell is formed on the substrate 100 in the NVM cell area 12-1. A gate dielectric layer 102-2 of the select transistor is formed on the substrate 100 in the select transistor area 12-2. The gate 106a-1 of the NVM cell is formed on the charge storage layer 102-1. The gate 106a-2 of the select transistor is formed on the gate dielectric layer 102-2. Both of the gates 106a-1 and 106a-2 are covered by the $SiO_2$ layer 114 for forming the first oxide layer of an ONO spacer, so that the distance between the gate 106a-1 of the NVM cell and each neighboring LDD region 120, and the distance between the gate 106a-2 of the select transistor and each neighboring LDD region 120 are both greater than the distance (zero) between the gate 106b and each LDD region 112 of the logic device.

The NVM cell to be finished in the area 12-1 will be coupled to the select transistor to be finished in the area 12-2, while sharing an LDD region 120 and a later formed source/drain (S/D) region with the select transistor. In addition, the charge storage layer 102-1 of the NVM cell may include an ONO composite layer including a tunnel $SiO_2$ layer 1023, a trapping SiN layer 1025 and a blocking $SiO_2$ layer 1027, from bottom to top, or include a stacked layer including a tunnel $SiO_2$ layer 1023, a floating gate 1025 and a blocking $SiO_2$ layer 1027, from bottom to top.

Referring to FIG. 1C, after the LDD regions 120 of the NVM device are formed, a substantially conformal SiN layer 122 for forming the nitride layer of the ONO spacer is formed on the $SiO_2$ layer 114, and then another substantially conformal $SiO_2$ layer 124 for forming the second oxide layer of the ONO spacer is formed on the SiN layer 122. The thickness of the SiN layer 122 may range from 150 Å to 300 Å. The thickness of the $SiO_2$ layer 124 may range from 250 Å to 500 Å.

Referring to FIG. 1D, the $SiO_2$ layer 124, the SiN layer 122 and the $SiO_2$ layer 114 are anisotropically etched to form an ONO spacer 130 on the sidewall of each of the gate 106a in the NVM device area 12 and the gate 106b in the logic device area 14. The ONO spacer 130 includes an L-shaped oxide layer 114a, an L-shaped nitride layer 122a on the sidewall and the bottom of the oxide layer 114a, and a thicker oxide layer 124a on the sidewall and the bottom of the nitride layer 122a. Since the inner border 1201 of each LDD region 120 of the NVM device is positioned between the corresponding sidewall 1061 of the gate 106a of the NVM device and the corresponding sidewall 1141 of the deposited $SiO_2$ layer 114 in the precedent process, the inner border 1201 is also positioned between the corresponding sidewall 1061 of the gate 106a of the NVM device and the corresponding sidewall 1141 of the oxide layer 114a of the ONO spacer 130 that is formed from the deposited $SiO_2$ layer 114.

Thereafter, S/D regions 132 of the NVM device are formed in the substrate 100 beside the ONO spacer 130 on the sidewall of the gate 106a of the NVM device in the NVM device area 12, and S/D regions 134 of the logic device formed in the substrate 100 beside the ONO spacer 130 on the sidewall of the gate 106b of the logic device in the logic device area 14.

Figure 2:
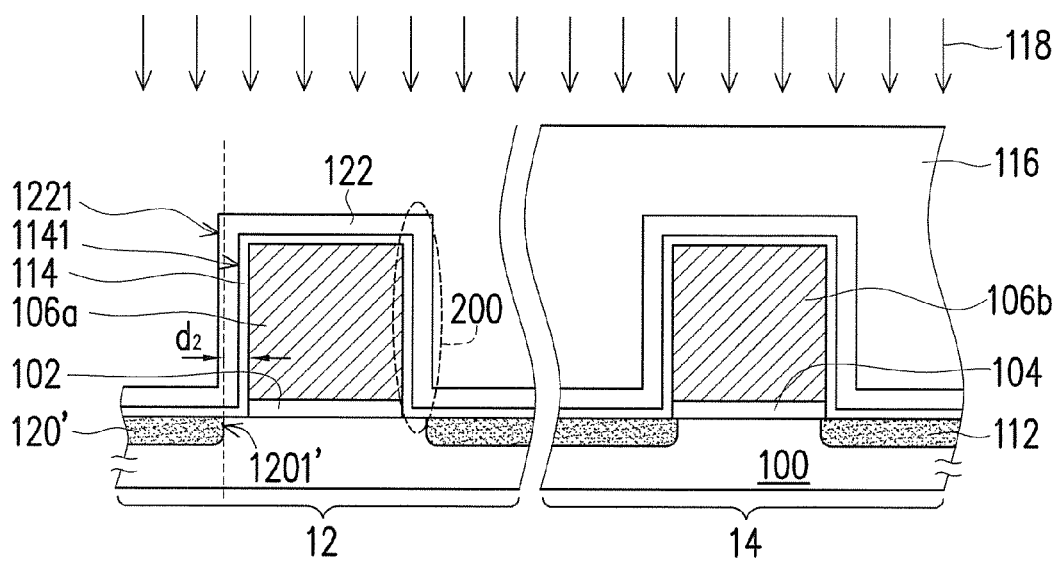
FIG. 2 illustrates a method for fabricating a semiconductor structure according to a second embodiment of this invention in which the LDD is implanted after the nitride layer of the ONO spacer is deposited.

Though the LDD implantation 118 is performed after the $SiO_2$ layer 114 for forming the first oxide layer of the ONO spacer is deposited in the first embodiment, it may alternatively be performed after the SiN layer 122 for forming the nitride layer of the ONO spacer is deposited in a second embodiment, as illustrated in FIG. 2. The $SiO_2$ layer 114 and the SiN layer 122 together serve as the claimed conformal layer in the second embodiment.

Referring to FIG. 2, in the second embodiment, the process of forming the patterned photoresist layer 116 and performing the LDD implantation 118 is moved to after the deposition of the SiN layer 122, so it is the sidewall portions 200 of the combination of the $SiO_2$ layer 114 and the SiN layer 122 that serve as an additional implantation mask, wherein each sidewall portion 200 is wider than each sidewall portion 1142 of the $SiO_2$ layer 114 that serves an additional implantation mask in the first embodiment. As a result, the distance $d_2$ between the gate 106a and each LDD region 120' of the NVM device in the second embodiment is greater than the distance $d_1$ between the gate 106a and each LDD region 120 of the NVM device in the first embodiment, and is even greater than the distance (zero) between the gate 106b and each LDD region 112 of the logic device.

In addition, due to the dopant diffusion, the inner border 1201' of each LDD region 120' of the NVM device in the second embodiment is positioned between the corresponding sidewall 1141 of the SiO₂ layer 114 and the corresponding sidewall 1221 of the SiN layer 122, as indicated by the dash line.

Since the conformal layer, which may include the first SiO₂ layer (114) for forming an ONO spacer or the combination of the first SiO₂ layer (114) and the SiN layer (122) for forming the same, has sidewall portions (1142 or 200) that also serve as a mask in the LDD implantation of the NVM device in the above embodiments, the opposite LDD regions beside the gate of the NVM device can be pulled back so that their distance is increased and problems such as the short-channel effect are avoided.

This invention has been disclosed above in the embodiments, but is not limited to those. It is known to people of ordinary skill in the art that some modifications and innovations may be made without departing from the spirit and scope of this invention. Hence, the scope of this invention should be defined by the following claims.

What is claimed is:

1. A semiconductor structure, comprising:
    a first device, comprising a first gate, and first lightly doped drain (LDD) regions beside the first gate; and
    a second device, comprising a second gate, and second LDD regions beside the second gate,
    wherein the first device comprises a logic device and the second device comprises an NVM device,
    each of the logic device and the NVM device comprises an ONO spacer that comprises a first silicon oxide (SiO₂) layer on a sidewall of the first or second gate, a silicon nitride (SiN) layer on a sidewall of the first SiO₂ layer, and a second SiO₂ layer on a sidewall of the SiN layer,
    each first LDD region of the logic device overlaps with the first gate, and
    an inner border of each second LDD region of the NVM device is positioned between the sidewall of the second gate and the sidewall of the first SiO₂ layer.

2. The semiconductor structure of claim 1, wherein a thickness of the first SiO₂ layer ranges from 30 Å to 150 Å.

3. The semiconductor structure of claim 1, wherein the NVM device comprises an NVM cell and a select transistor coupled to the NVM cell.

4. The semiconductor structure of claim 1, wherein the NVM device comprises an NVM cell that has a charge storage layer under the second gate.

5. The semiconductor structure of claim 4, wherein the charge storage layer comprises an ONO composite layer.

* * * * *